United States Patent
Palsule et al.

(10) Patent No.: US 7,704,780 B2
(45) Date of Patent: Apr. 27, 2010

(54) OPTICAL ENHANCEMENT OF INTEGRATED CIRCUIT PHOTODETECTORS

(75) Inventors: Chintamani Palsule, Fort Collins, CO (US); John H. Stanback, Fort Collins, CO (US); Thomas E. Dungan, Fort Collins, CO (US); Mark D. Crook, Fort Collins, CO (US)

(73) Assignee: Aptina Imaging Corporation, Grand Cayman (KY)

( * ) Notice: Subject to any disclaimer, the term of this patent is extended or adjusted under 35 U.S.C. 154(b) by 0 days.

(21) Appl. No.: 12/273,123

(22) Filed: Nov. 18, 2008

(65) Prior Publication Data
US 2009/0081822 A1 Mar. 26, 2009

Related U.S. Application Data

(62) Division of application No. 11/716,863, filed on Mar. 12, 2007, now Pat. No. 7,459,733, which is a division of application No. 10/984,670, filed on Nov. 9, 2004, now Pat. No. 7,208,783.

(51) Int. Cl.
*H01L 21/00* (2006.01)
(52) U.S. Cl. .......................... 438/69; 438/71; 438/791; 257/233; 257/292; 257/432; 257/E33.076; 257/E31.127
(58) Field of Classification Search ............... 438/69, 438/71, 791; 257/233, 292, 432, E33.076
See application file for complete search history.

(56) References Cited

U.S. PATENT DOCUMENTS

| 5,781,233 | A | 7/1998 | Liang et al. |
| 5,796,154 | A | 8/1998 | Sano et al. |
| 6,362,498 | B2 | 3/2002 | Abramovich |
| 6,362,513 | B2 | 3/2002 | Wester |
| 6,661,046 | B2 | 12/2003 | Kim |
| 2001/0010952 | A1 | 8/2001 | Abramovich |
| 2001/0042876 | A1 | 11/2001 | Wester |
| 2002/0079504 | A1 | 6/2002 | Kim |
| 2004/0033640 | A1 | 2/2004 | Izumi et al. |

(Continued)

FOREIGN PATENT DOCUMENTS

EP 0744778 A1 11/1996

(Continued)

OTHER PUBLICATIONS

UK Intectual Property Office Examination Report, Nov. 3, 2008, for GB0522758.2.

(Continued)

*Primary Examiner*—Tu-Tu V Ho
(74) *Attorney, Agent, or Firm*—RatnerPrestia

(57) ABSTRACT

A semiconductor integrated circuit structure and method for fabricating. The semiconductor integrated circuit structure includes a light sensitive device integral with a semiconductor substrate, a cover dielectric layer disposed over the light sensitive device, and a lens-formation dielectric layer disposed over the cover dielectric layer. Light is transmittable though the cover dielectric layer, and through the lens-formation dielectric layer. The lens-formation dielectric layer forms an embedded convex microlens. The microlens directs light onto the light sensitive device.

11 Claims, 8 Drawing Sheets

U.S. PATENT DOCUMENTS

2004/0211884 A1* 10/2004 Fang et al. ............... 250/214.1
2004/0214368 A1 10/2004 Rhodes
2006/0057765 A1 3/2006 Hsu et al.

FOREIGN PATENT DOCUMENTS

| EP | 1473780 A2 | 11/2004 |
| EP | 1626442 | 2/2006 |
| JP | 62023161 | 1/1987 |
| JP | 2003338613 | 11/2003 |

OTHER PUBLICATIONS

Chinese Official Action, issued (Code A130) of Sipo on Jun. 6, 2008, for PRC. Pat. Appln. No. 2005100931682.

* cited by examiner

OPTICAL ENHANCEMENT OF INTEGRATED CIRCUIT PHOTODETECTORS

This application is a Divisional of U.S. patent application Ser. No. 11/716,863, filed Mar. 12, 2007, which itself is a divisional Ser. No. 10/984,670, filed on Nov. 9, 2004, and now issued as U.S. Pat. No. 7,208,783, and the contents of each are incorporated herein by reference.

BACKGROUND

With the advent of modern electronic scanners, digital cameras, and other products, light sensitive elements are becoming more and more common in these and other modern electronic systems. A semiconductor p-n junction diode is often used for the detection of light signals. When in use as a photodetector, the p-n junction is typically reverse biased. As such, light illuminating the p-n junction generates hole-electron pairs in the depletion region which are swept out of the depletion region in opposite directions. Depending upon the application, either a generated current due to electron-hole pair movement or a change in junction potential due to collapse of the depletion region is detected as the signal indicative of the incident light intensity.

A p-n junction diode intended for use as a photodetector is often referred to as a photodiode. Various physical mechanisms act to limit the ability of the photodiode and photodiode arrays to detect and specially resolve low levels of light. Important among these mechanisms are noise, surface reflectivity, leakage currents, and cross-talk. Noise may be due to random fluctuations in light signal intensity, thermal mechanisms, and other causes. Other characteristics of the photodiode, such as depth of the junction below the semiconductor surface and width of depletion region, also influence the sensitivity of the photodiode to the incident light.

Leakage currents in photodiodes are often referred to as the dark current of the device, i.e., the biased diode's current in the absence of any light. Leakage currents can be caused by surface and bulk defects in the semiconductor which give rise to mid-gap states sufficiently dense to provide leakage current paths across the device. These defects can be either native (generated during silicon wafer/epitaxial layer fabrication) or generated during the subsequent processing steps used in typical integrated circuit fabrication processes. One such processing step is the formation of a silicide layer on polysilicon and silicon surfaces. Silicide is a binary compound of silicon and a metal. Silicides can be formed by first depositing a metal on polysilicon or silicon and subsequently reacting the metal with the polysilicon or the silicon in a high temperature annealing process. Typically, this reaction is accompanied by a significant change in volume (before and after the reaction) for the metal and silicon. This results in a significant amount of stress on the remaining silicon which is usually accommodated by the creation of various defects in the silicon. As a result, it is necessary to block silicide formation in photodiode areas for high performance image sensors. This is typically accomplished by using a silicide block layer on top of silicon or polysilicon that prevents the chemical reaction between the metal and silicon. Another important reason for including a silicide block layer is that titanium silicide is light absorbing which would greatly impact the light collection of a photosensitive device should titanium be deposited over the photosensitive device as a part of the processing. Typically mixed signal CMOS processes and CMOS image sensor processes use a layer of silicon dioxide or silicon nitride as a silicide block layer.

In addition, depending upon the surface condition of the semiconductor, a significant fraction of the light signal may be reflected rather than absorbed, thereby reducing the sensitivity of the photodiode to low light levels. For applications wherein the anticipated light levels are low, it is important to have photosensitive devices capable of collecting as much of the incident light as possible while maintaining a low level of noise and leakage current.

SUMMARY

In a representative embodiment, a semiconductor integrated circuit structure is disclosed. The semiconductor integrated circuit structure comprises a light sensitive device integral with a semiconductor substrate, a first dielectric layer disposed over the light sensitive device, and a second dielectric layer disposed over the first dielectric layer. The semiconductor substrate is silicon. Light is transmittable though the first dielectric layer and through the second dielectric layer. The first dielectric layer is fabricated from a silicide blocking material. The index of refraction of the first dielectric layer at a preselected light frequency is within twenty-five percent of the square root of the product of index of refraction of the semiconductor substrate and index of refraction of the second dielectric layer, and the thickness of the first dielectric layer is within twenty-five percent of length of a quarter wavelength of light at the preselected frequency in the first dielectric layer.

In another representative embodiment, a method for fabricating the semiconductor integrated circuit structure is disclosed. The method comprises creating a light sensitive device, disposing a first dielectric layer over the light sensitive device, and disposing second dielectric layer over the first dielectric layer. The semiconductor substrate is silicon. Light is transmittable though the first dielectric layer and through the second dielectric layer. The first dielectric layer is fabricated from a silicide blocking material. The index of refraction of the first dielectric layer at a preselected light frequency is within twenty-five percent of the square root of the product of index of refraction of the semiconductor substrate and index of refraction of the second dielectric layer, and the thickness of the first dielectric layer is within twenty-five percent of length of a quarter wavelength of light at the preselected frequency in the first dielectric layer.

In yet another representative embodiment, a semiconductor integrated circuit structure is disclosed. The semiconductor integrated circuit structure comprises a light sensitive device integral with a semiconductor substrate, a cover dielectric layer disposed over the light sensitive device, and a lens-formation dielectric layer disposed over the cover dielectric layer. Light is transmittable though the cover dielectric layer; and through the lens-formation dielectric layer. The lens-formation dielectric layer forms an embedded convex microlens. The microlens directs light onto the light sensitive device.

In still another representative embodiment, a method for fabricating a semiconductor integrated circuit structure is disclosed. The method comprises creating a light sensitive device integral with a semiconductor substrate, disposing a cover dielectric layer over the light sensitive device, and disposing a lens-formation dielectric layer over the cover dielectric layer. Light is transmittable though the cover dielectric layer and through the lens-formation dielectric layer. The lens-formation dielectric layer forms an embedded convex microlens. The microlens directs light onto the light sensitive device.

Other aspects and advantages of the representative embodiments presented herein will become apparent from the following detailed description, taken in conjunction with the accompanying drawings.

BRIEF DESCRIPTION OF THE DRAWINGS

The accompanying drawings provide visual representations which will be used to more fully describe various representative embodiments and can be used by those skilled in the art to better understand them and their inherent advantages. In these drawings, like reference numerals identify corresponding elements.

DETAILED DESCRIPTION

Figure 1:
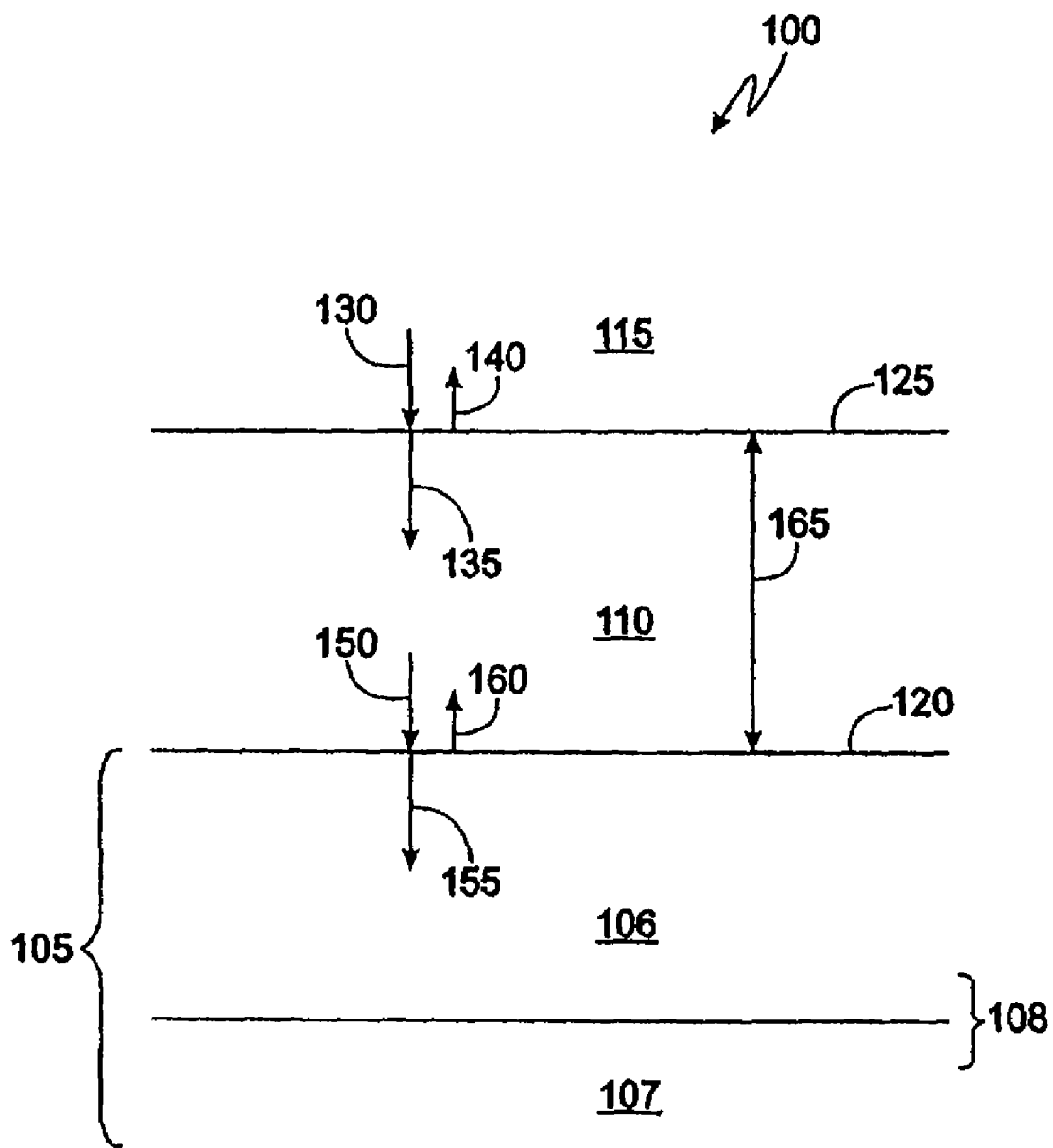
FIG. 1 is a drawing of incident, reflected, and transmitted components of normally incident light at various surfaces of a semiconductor integrated circuit structure as described in various representative embodiments.

As shown in the drawings for purposes of illustration, novel techniques are disclosed herein for enhancing the optical sensitivity of photosensitive elements in semiconductor integrated circuit structures. The present techniques utilize a special layer which has been adjusted in thickness and refractive index to increase the transmitted component of incident light, as well as to provide silicide blocking capability for the desired silicon and/or polysilicon regions in the circuit. In certain select areas of the circuit, this layer or a similar one can also serve as a microlens, thus, focusing the light onto a desired photodiode region.

Using these techniques, the optical sensitivity of CMOS image sensors and other light sensitive devices can be increased by using a special layer which can serve as a silicide block layer as well as an antireflective coating on top of silicon and/or as a microlens embedded between, for example, field oxide and pre-metal dielectric layers. The term field oxide is used to indicate an oxide used to electrically isolate different regions of an integrated circuit from each other. Also, an embedded microlens will help improve the sensitivity of light sensitive devices that utilize, for example, a photodiode buried under field oxide. Such a microlens can reduce optical cross-talk between adjacent light sensitive devices significantly as, for example, in CMOS image sensors that use multiple layers of interconnect where the aspect ratio of the dielectric stack height to the size of the photodiode can be very large.

For low leakage CMOS image sensor processes and other processes used to fabricate light sensitive devices, some type of passivation layer to block the formation of silicides, referred to herein as a silicide block layer, is needed to protect certain areas of silicon from silicide formation. In such CMOS image sensors, the silicide block layer is used to obtain the desired low leakage performance in most of the silicon region in the photodiode, as well as the transistor source/drain regions in the remaining pixel area. Representative embodiments disclosed herein use innovative process integration sequences to enhance optical sensitivity of the light detection areas. Such enhanced optical sensitivity and low leakage performance will produce higher signal to noise ratios.

A typical sensor pixel comprises a photodiode and a set of three or four transistors depending upon the pixel architecture. The photodiode p-n junction can be close to the silicon surface (n+/p-substrate or p+/n-substrate) or buried under field oxide (n-well/p-substrate). In representative embodiments, techniques are disclosed for enhancement of sensitivity of these pixels.

In representative embodiments, a silicon-rich oxynitride $Si_XO_YN_Z$ is used as the silicide block layer and as an antireflective coating on top of the silicon. Si stands for the silicon component of the compound, O stands for the oxygen component, and N stands for the nitrogen component. The refractive index is typically adjustable between 1.70-1.85 by changing the relative fractional atomic compositions X, Y, and Z respectively of silicon, oxygen, and nitrogen. Individually X, Y, and Z are each typically greater than or equal to 0.01 and less than or equal to 0.98 with the sum of X, Y, and Z being one.

With appropriate etching, this silicon-rich oxynitride layer can also be used to form a microlens embedded between the field oxide and pre-metal dielectric . The index of refraction and thickness of the silicide block layer (silicon-rich oxynitride) can be adjusted such that the silicide block layer performs the functions of both blockage of silicide formation and of an antireflective coating. Depending upon the desired wavelength at which maximum sensitivity improvement is desired, the thickness of the silicon-rich oxynitride film and the refractive index of the film can be adjusted to provide reduced reflection of incident light. The refractive index of the silicon-rich oxynitride can be adjusted by using the appropriate ratio of reactant gases during plasma-enhanced chemical vapor deposition. Among other techniques, the thickness of the silicon-rich oxynitride can be adjusted by adjusting the duration of the plasma-enhanced chemical vapor deposition.

The silicide block layer can also be used in the formation of a microlens which could be, for example, embedded between the pre-metal dielectric oxide layer and the field oxide layer on silicon. In representative embodiments, a silicon-rich oxynitride layer is deposited on top of the wafer after source/drain anneals but prior to entering the silicide module. A first mask defines an embedded microlens on top of the field oxide. The resist is reflowed to attain the intended microlens shape. A subsequent etch which has very low selectivity between the resist and the silicon rich oxynitride layer transfers the shape of the resist into the silicon-rich oxynitride file Then a second mask is used to define the areas that do not require the silicide block. In another representative embodiment, a thicker layer of oxynitride is deposited with thickness and index of refraction adjusted such that following the etch of the oxynitride film, the oxynitride layer can also act as an antireflective coating on the remaining silicon regions, as well as forming a microlens in specified field oxide areas.

In the following detailed description and in the several figures of the drawings, like elements are identified with like reference numerals.

FIG. 1 is a drawing of incident, reflected, and transmitted components of normally incident light at various surfaces of a semiconductor integrated circuit structure 100 as described in various representative embodiments. In FIG. 1, the semiconductor integrated circuit structure 100 is shown in cross section and includes a semiconductor 105 on which is formed a first dielectric layer 110. The first dielectric layer 110 has a thickness 165. On top of the first dielectric layer 110 is formed a second dielectric layer 115. The semiconductor 105 and the first dielectric layer 110 meet at a first interface 120. The first dielectric layer 110 and the second dielectric layer 115 meet at a second interface 125. Also shown in FIG. 1 are a set of arrows representing the general case of a first incident light wave 130, a first transmitted light wave 135, a first reflected light wave 140 at the second interface 125, and a second incident light wave 150, a second transmitted light wave 155, and a second reflected light wave 160 at the first interface 120.

In representative embodiments, the semiconductor 105 is silicon and for such representative embodiment will also be referred to herein as the silicon layer 105, the first dielectric layer 110 is typically silicon-rich oxynitride having an index of refraction adjustable in the range of 1.70 to 1.85 by changing the relative atomic percentages of silicon, oxygen and nitrogen. For such representative embodiments, the first dielectric layer 110 will also be referred to herein as the antireflection/silicide-block layer 110, and in representative embodiments, the second dielectric layer 115 is silicon dioxide and for such representative embodiments will also be referred to herein as the oxide layer 115.

The second dielectric layer 115 could also be $Si_U O_V H_W$ wherein H stands for the hydrogen component of the compound and wherein U, V, and W are the relative fractional atomic compositions respectively of silicon, oxygen, and hydrogen. The semiconductor 105 also comprises a first and a second semiconductor layers 106,107 wherein the first and the second semiconductor layers 106,107 have different polarities of majority carriers. The first semiconductor layer 106 is in contact with the first dielectric layer 110 at the first interface 120. The first semiconductor layer 106 lies on top of the second semiconductor layer 107. A p-n diode 108 is formed at the boundary between the first and second semiconductor layers 106,107. When sensitive to illumination, p-n diode 108 becomes light sensitive device 108 which is also referred to as photodiode 108. Using different structures, it is also possible to construct other light sensitive devices 108 such as, for example, phototransistors and light sensitive resistors. In representative embodiments, the second semiconductor layer 107 could be the silicon substrate itself and could be either p-type or n-type. Alternatively, the second semiconductor layer 107 could be an epitaxial layer on top of the silicon substrate or could be diffused into the silicon substrate. The first semiconductor layer 106 could be an epitaxial layer grown on top of the substrate, could be diffused into an epitaxial layer on top of the substrate, or could be fabricated by other appropriate method. Other methods of creating the first and the second semiconductor layers 106, 107 are also possible. Regardless, the majority carrier of the second semiconductor layer 107 has opposite polarity to that of the first semiconductor layer 106.

For a given frequency of incident light, it has been demonstrated that the first reflected light wave 140 can be cancelled out at the second interface 125 for a preselected frequency if the following two conditions are met.

(1) The square of the index of refraction of the first dielectric layer 110 is equal to the index of refraction of the semiconductor 105 multiplied by the index of refraction of the second dielectric layer 115, i.e., $$(n_1)^2 = (n_0 \times n_2)$$ Equation 1 where $n_0$ is the index of refraction of the semiconductor 105, $n_1$ is the index of refraction of the first dielectric layer 110, and $n_2$ is the index of refraction of the second dielectric layer 115. For a derivation of this equation see *Optics* by John David Jackson [Addison-Wesley Longman, Inc.: Reading, Mass., p. 420 (1998)] which is incorporated herein by reference.

(2) The thickness of the first dielectric layer 110 is equal to a quarter wavelength in the first dielectric layer 110, i.e., $$d = \lambda_1 / 4$$ Equation 2 wherein $\lambda_1$ is the wavelength of light at the preselected frequency in the first dielectric layer 110. Since the wavelength of light at the preselected frequency in the first dielectric layer 110 is equal to the wavelength of the light in vacuum divided by the index of refraction of the first dielectric layer 110, Equation 2 can be rewritten as $$d = \lambda_v / (4 * n_1)$$ Equation 3 wherein $\lambda_v$ is the wavelength of light at the preselected frequency in vacuum.

Substantial reduction in the first reflected light wave 140 can be obtained if the index of refraction of the first dielectric layer 110 at the given light frequency is within twenty-five percent of the square root of the product of index of refraction of the semiconductor substrate 105, i.e. the semiconductor 105, and index of refraction of the second dielectric layer 115, and if the thickness 165 of the first dielectric layer 110 is within twenty-five percent of length of a quarter wavelength of light at the preselected frequency in the first dielectric layer 110.

Figure 2:
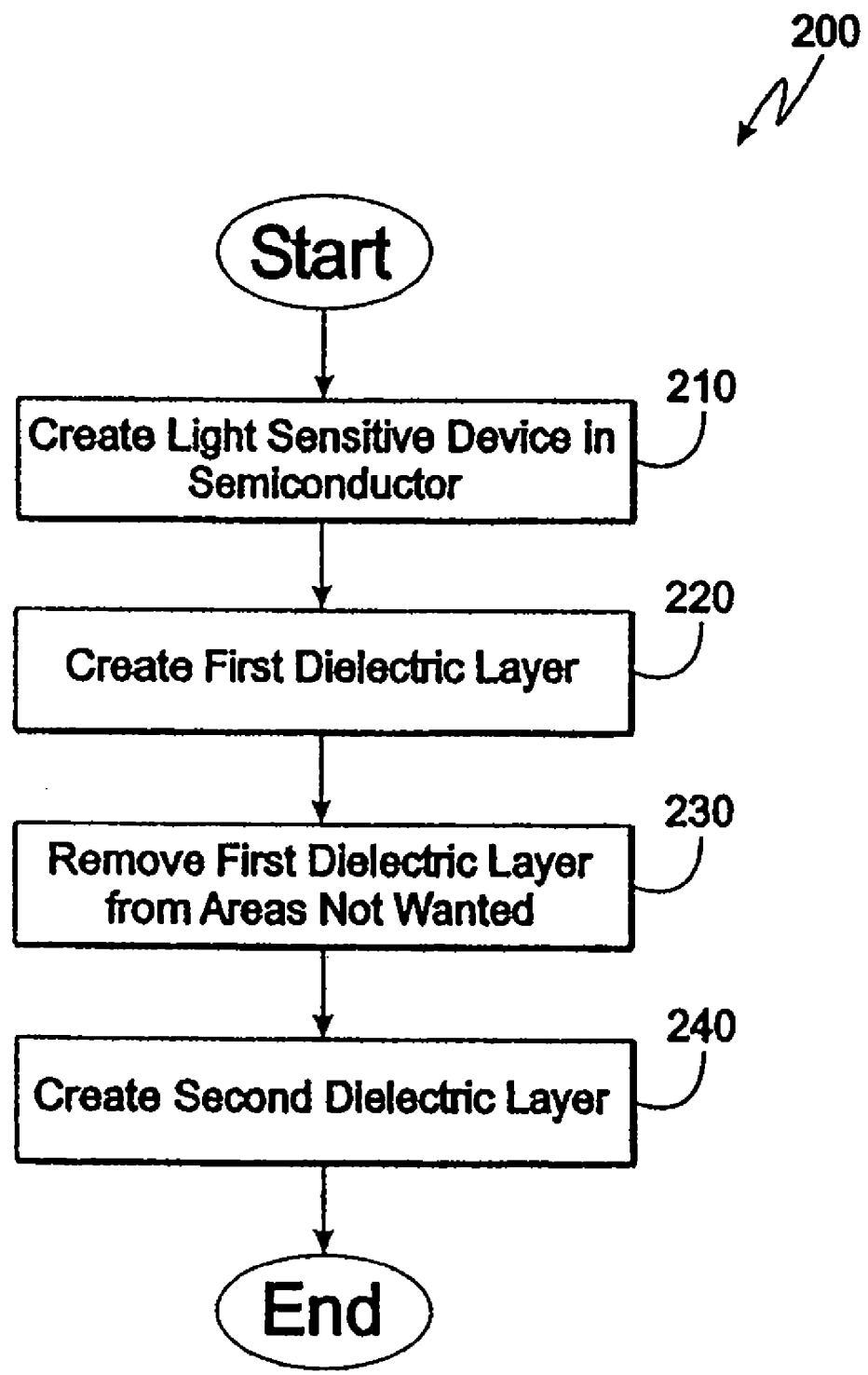
FIG. 2 is a flow chart of a method for creating a light sensitive, semiconductor integrated circuit structure as described in various representative embodiments.

FIG. 2 is a flow chart of a method 200 for creating a light sensitive, semiconductor integrated circuit structure 100 as described in various representative embodiments. In block 210 of FIG. 2, a light sensitive device is created within the semiconductor 105. This light sensitive device 108 could be, for example, a p-n junction diode 108 or other appropriate light sensitive device 108 created in a semiconductor such as silicon. The p-n junction could be created by, for example, diffusing an n+ layer into a p-type substrate or by one of several other techniques well known to those of ordinary skill in the art. Block 210 then transfers control to block 220.

In block 220, the first dielectric layer 110 is created on top of the semiconductor 105. The first dielectric layer 110 could be, for example, a silicon-rich oxynitride layer or the like. The first dielectric layer 110 could be fabricated by chemical vapor deposition or by one of several other techniques well known to those of ordinary skill in the art. Block 220 then transfers control to block 230.

In block 230, the first dielectric layer 110 is removed from those areas of the wafer over which it is not needed. Such removal may include the steps of applying photoresist to the wafer, exposing the photoresist per the pattern desired, developing the exposed photoresist which results in removing the unexposed photoresist (or conversely removing the exposed photoresist), etching the first dielectric layer 110 in the photoresist exposed areas, and finally removing the remaining photoresist. Block 230 then transfers control to block 240.

In block 240, the second dielectric layer 115 is created on top of the first dielectric layer 110. The second dielectric layer 115 could be, for example, an oxide layer or the like. The second dielectric layer 115 could be fabricated by thermal oxidation, chemical vapor deposition or by one of several other techniques well known to those of ordinary skill in the art. Block 240 then terminates the process.

Depending upon the intended final configuration of the resultant integrated circuit structure, various steps in the above process may or may not be included.

Figure 3:
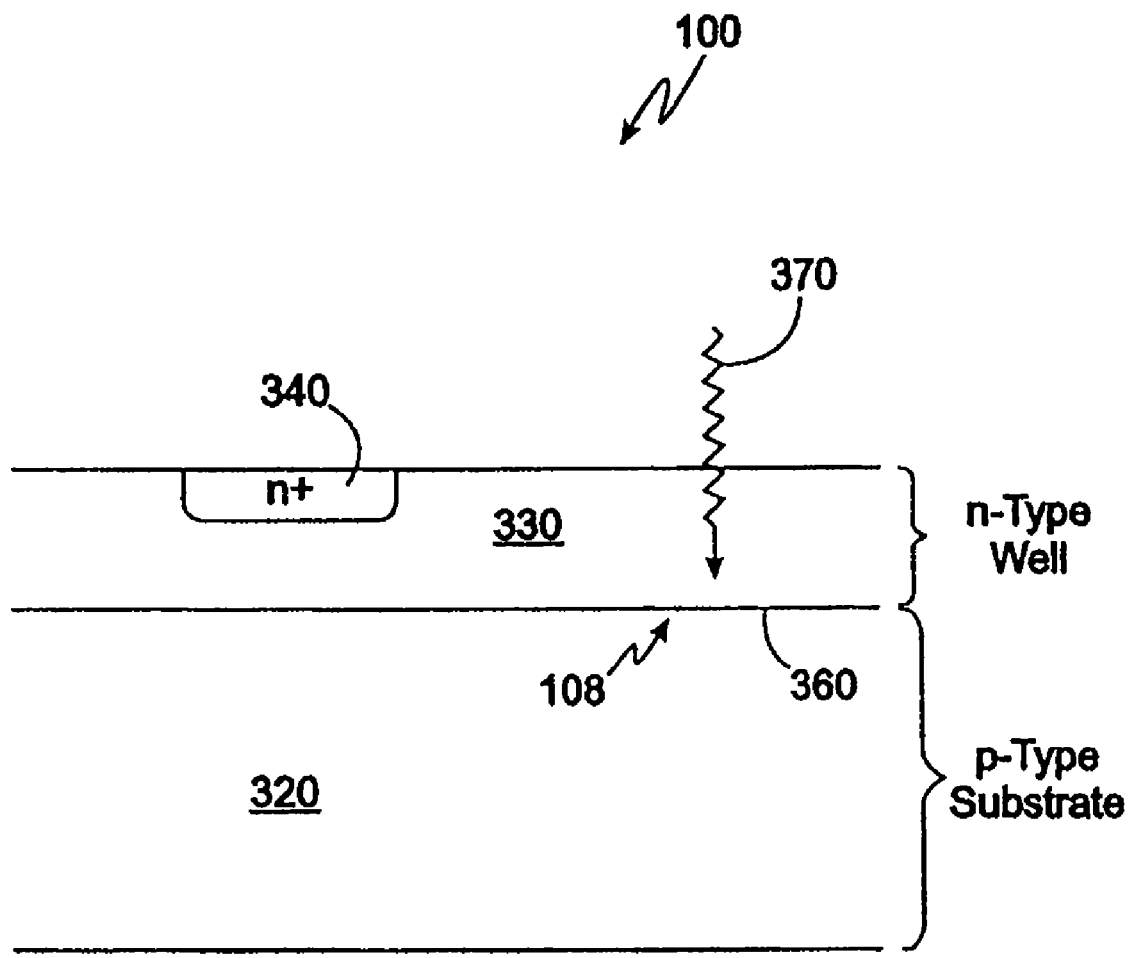
FIG. 3 is a cross-sectional drawing of p-n junction photodiode in a semiconductor integrated circuit structure as described in various representative embodiments.

FIG. 3 is a cross-sectional drawing of p-n junction photodiode 108 in the semiconductor integrated circuit structure 100 as described in various representative embodiments. FIG. 3 shows a semiconductor substrate 320, which in the representation of FIG. 3 is p-type, having a well 330, also referred to herein as a diffusion well 330, which in the representation of FIG. 3 is n-type, with a diffusion region 340, which in the representation of FIG. 3 is n+. p-n diode 108 is created at p-n junction 360. Light 370 is shown incident upon the p-n junction 360 in FIG. 3. Again, due to its intended purpose, diode 108 is often referred to as photodiode 108.

Figure 4:
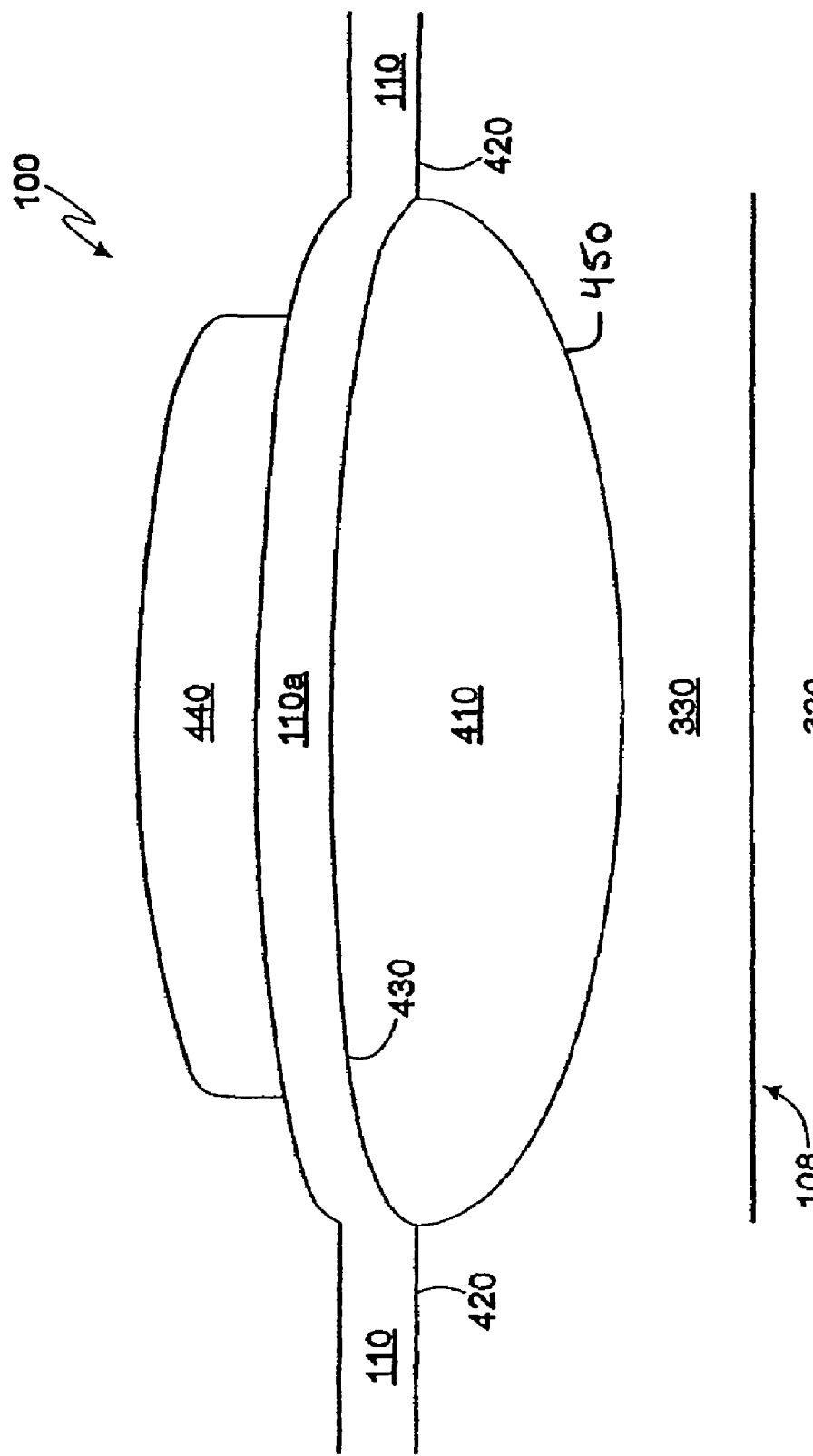
FIG. 4 is a cross-sectional drawing of the semiconductor integrated circuit structure as described in various representative embodiments.

FIG. 4 is a cross-sectional drawing of the semiconductor integrated circuit structure 100 as described in various representative embodiments. In FIG. 4, an n-type well 330 has been created in a p-type semiconductor substrate 320. A portion of the silicon is recessed from the silicon top surface 420, for example by etching a part of the silicon. An oxide 410, also referred to herein as a field oxide 410 and as a cover dielectric layer 410, is then grown in that area The volume of the recessed silicon area is such that after field oxide 410 growth, the topography created by the step between the field oxide 410 and the silicon top surface 420 is minimized and the resultant surface is more nearly planar with the silicon top surface 420.

On top of the field oxide 410, a lens-formation dielectric layer 110a is created. This lens-formation dielectric layer 110a is typically the same layer and material as the antireflection/silicide-block layer 110 which can also cover areas of the un-oxidized portions of the n-well 330, as well as other parts of the remaining circuitry of the semiconductor wafer as specified by the integrated circuit designer. The lens-formation dielectric layer 110a is conformal so that it follows the topography of the field oxide upper surface 430, the upper surface of the remaining portions of the n-well 330, and the upper surface of the remaining portions of the semiconductor wafer. In particular, the geometry of the lens-formation dielectric layer 110a will follow the shape of the field oxide upper surface 430. Then a layer of photoresist is applied over the semiconductor wafer, exposed, and developed. A representative example of the final developer geometry of photoresist 440, also referred to herein as a patterned photoresist layer 440, is shown in FIG. 4.

Figure 5:
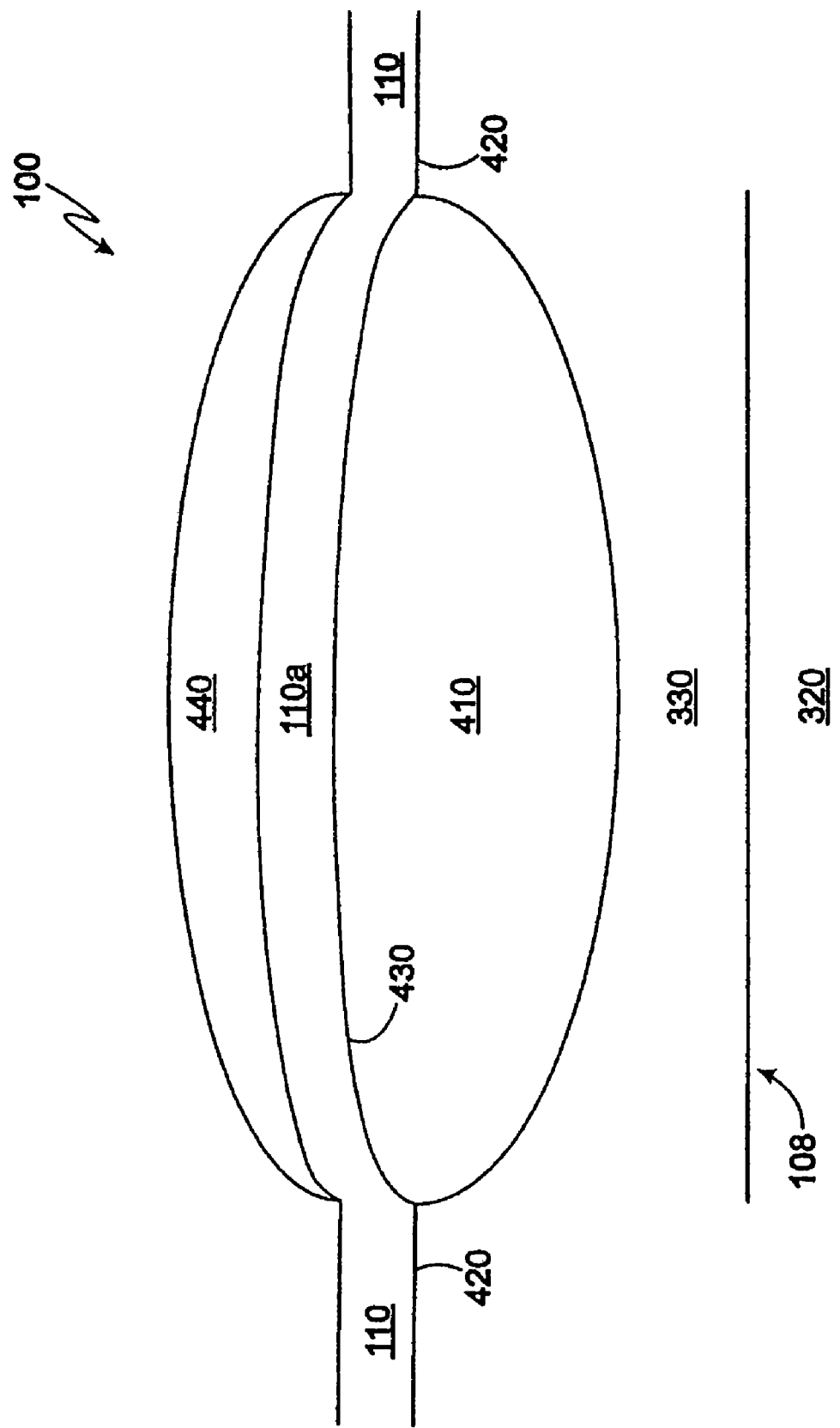
FIG. 5 is another cross-sectional drawing of the semiconductor integrated circuit structure as described in various representative embodiments.

FIG. 5 is another cross-sectional drawing of the semiconductor integrated circuit structure 100 as described in various representative embodiments. FIG. 5 shows the photoresist 440 after it has been reflowed by, for example, the application of heat. The geometry of the photoresist 440 now has formed curved convex edges which extend close to the edges of the curvature of the field oxide upper surface 430.

Figure 6:
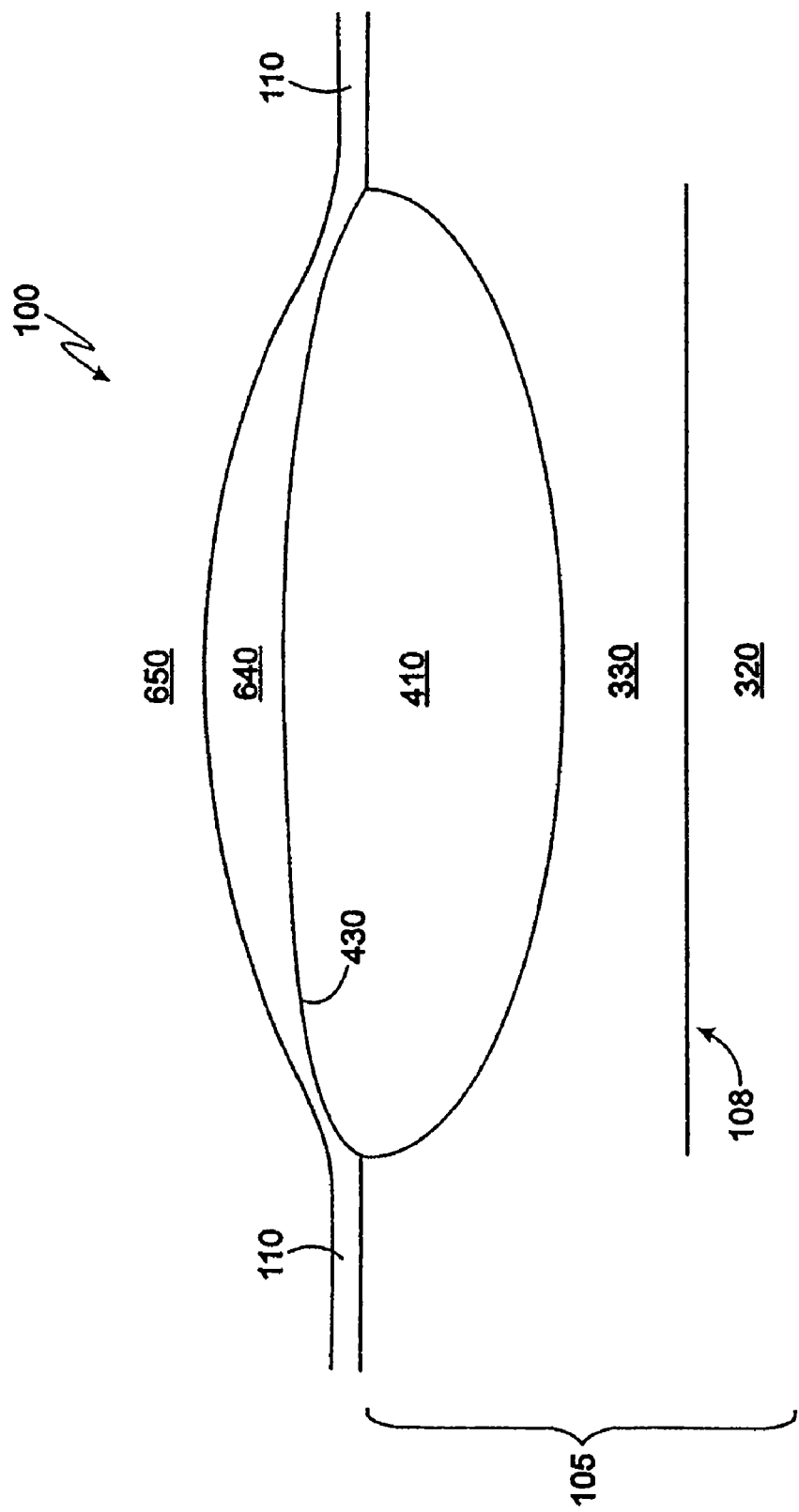
FIG. 6 is yet another cross-sectional drawing of the semiconductor integrated circuit structure as described in various representative embodiments.

FIG. 6 is yet another cross-sectional drawing of the semiconductor integrated circuit structure 100 as described in various representative embodiments. An etch having very low selectivity between the photoresist 440 and the lens-formation dielectric layer 118a is applied to the structure shown in FIG. 5 which transfers the shape of the reflowed photoresist 440 to a new shape of the lens-formation dielectric layer 110a thereby forming an embedded convex microlens 640 out of the lens-formation dielectric layer 110a over the field oxide 410 as shown in FIG. 6. Then another photoresist mask can be used to define areas of the integrated circuit that will not require the first dielectric layer 110, and an additional oxide layer 650 can be created on top of the lens-formation dielectric layer 110a and other areas of the integrated circuit.

In another representative embodiment, the index of refraction of the antireflection/silicide-block layer 110 and the thickness of the antireflection/passivation layer 110 remaining on top of the semiconductor 105 in areas other than in the area of the microlens 640, can be adjusted to act as antireflective coating on the remaining silicon regions as specified by Equations 1-3 above. Since the material comprising the microlens 640 is the same as that comprising the antireflection/silicide-block layer 110, the index of refraction is the same in both areas.

Figure 7:
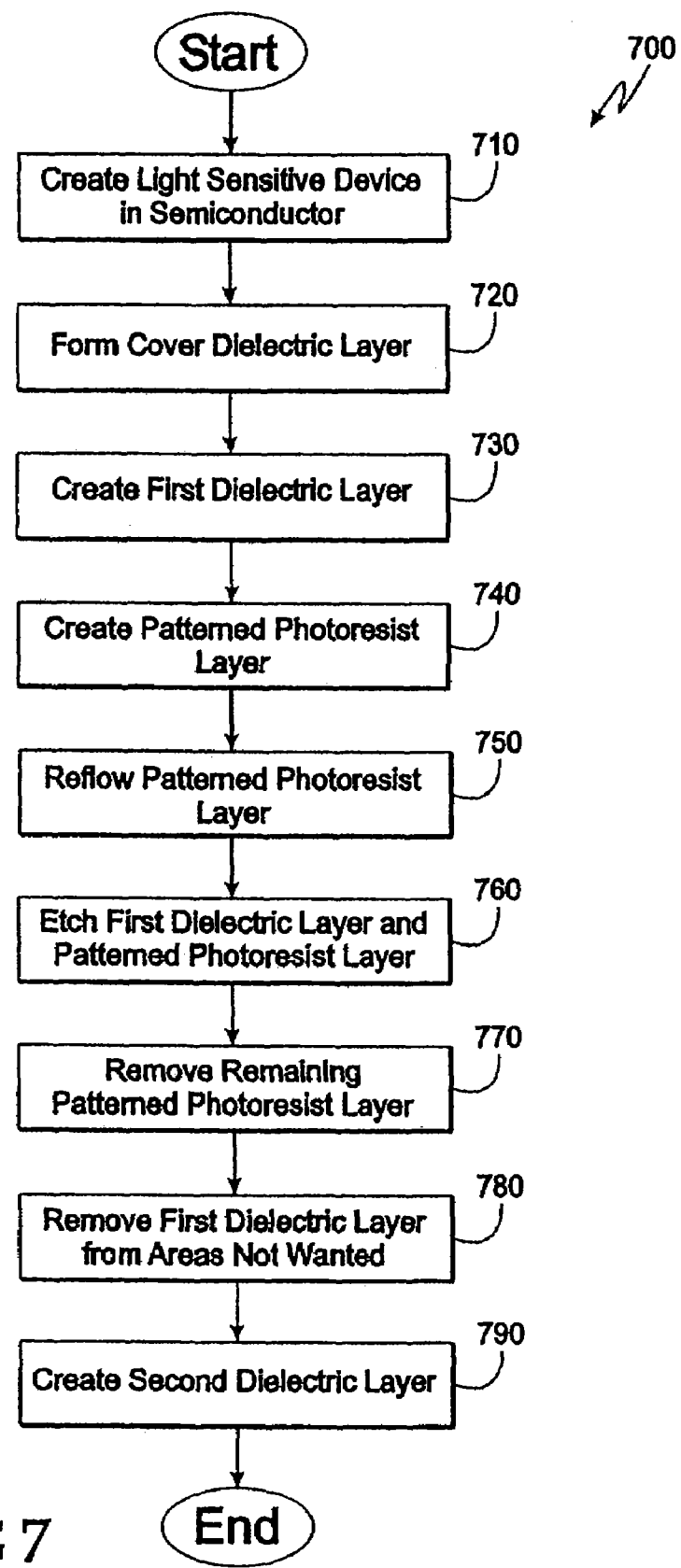
FIG. 7 is a flow chart of another method for creating a light sensitive, semiconductor integrated circuit structure as described in various representative embodiments.

FIG. 7 is a flow chart of another method 700 for creating a light sensitive, semiconductor integrated circuit structure 100 as described in various representative embodiments. In block 710 of FIG. 7, a light sensitive device 108 is created within the semiconductor 105. This light sensitive device 108 could be, for example, a p-n junction diode or other appropriate light sensitive device created in a semiconductor such as silicon The p-n junction could be created by, for example, diffusing an n-type layer into a p-type substrate or by one of several other techniques well known to those of ordinary skill in the art. Block 710 then transfers control to block 720.

In block 720, the cover dielectric layer 410 is created in selected areas of the wafer. Depending upon the process used, such creation may include the steps of applying photoresist to the wafer, exposing the photoresist per the pattern desired, and developing the exposed photoresist which results in removing the unexposed photoresist (or conversely removing the exposed photoresist), etching the semiconductor 105 in the photoresist exposed areas, removing the remaining photoresist and creating the cover dielectric layer (field oxide) 410 in the etched areas. Block 720 then transfers control to block 730.

In block 730, the first dielectric layer 110 is created on top of the semiconductor 105. The first dielectric layer 110 could be, for example, a silicon-rich oxynitride layer or the like. The first dielectric layer 110 could be fabricated by chemical vapor deposition or by one of several other techniques well known to those of ordinary skill in the art. Block 730 then transfers control to block 740.

Figure 8:
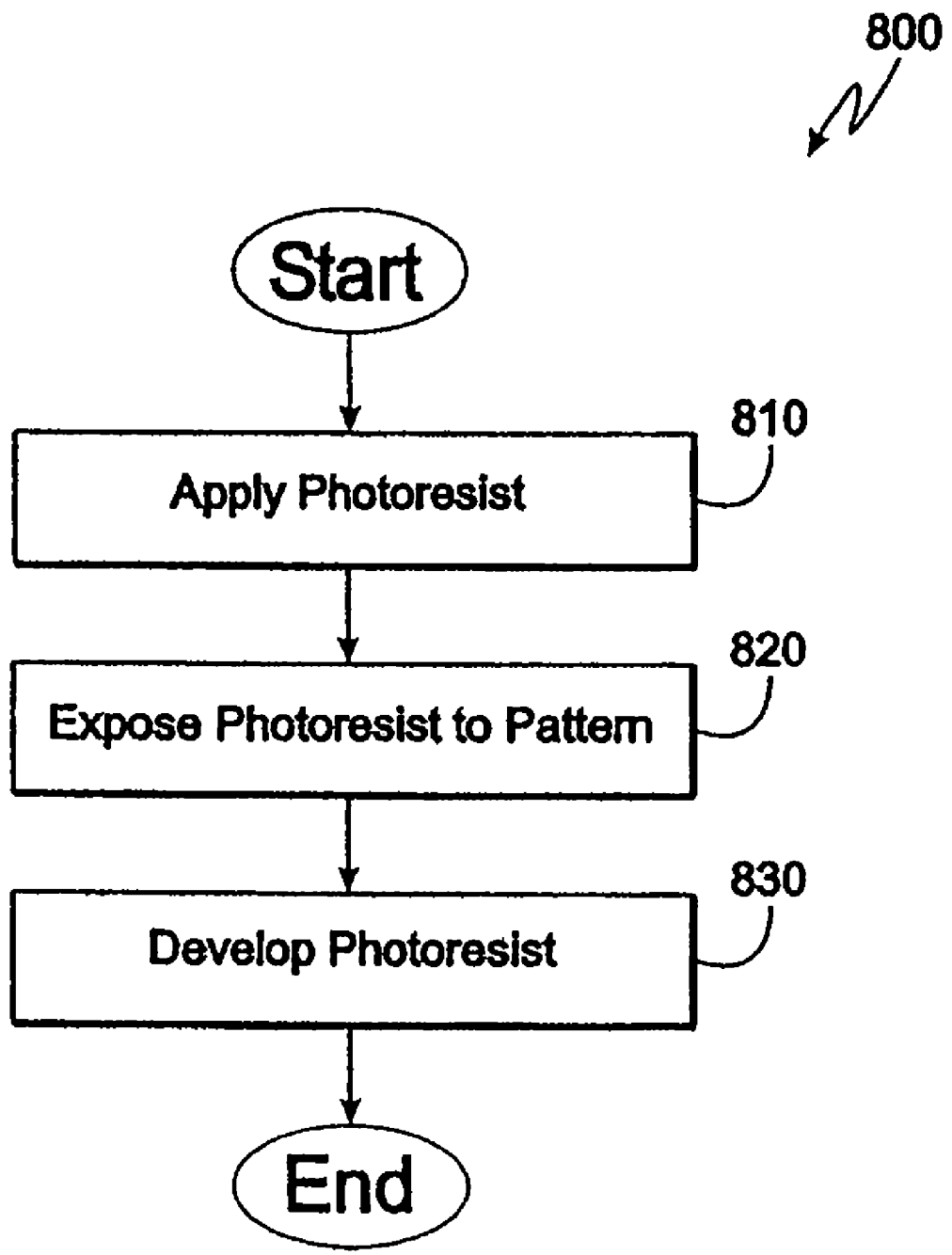
FIG. 8 is a flow chart of sub-steps of the flow chart of FIG. 7.

In block 740, a patterned photoresist layer 440 is created on top of the wafer in those areas over which it is intended to create a microlens 640. In a representative example, those areas could be the field oxide 410 areas. Depending upon the process used, such creation may include the steps of applying photoresist to the wafer, exposing the photoresist per the pattern desired, and developing the exposed photoresist which results in removing the unexposed photoresist (or conversely removing the exposed photoresist) in conformance with the preselected pattern. These sub-steps are shown in FIG. 8. Block 740 then transfers control to block 750.

In block 750, the patterned photoresist layer 440 is reflowed such that the edges of the patterned photoresist layer 440 become convex. Such reflow could be effected by the addition of heat to the wafer for a period of time. The appropriate temperature and time is dependent upon the particular photoresist used and the result desired. Block 750 then transfers control to block 760.

In block 760, the wafer is etched with an etch having very low selectivity between the photoresist 440 and the lens-formation dielectric layer 110a. Most dry etch processes have a chemical (actual reaction) component and a physical component (sputtering due to high energy ion bombardment). As such, the physical component is not very selective, while the chemical component is selective. By increasing the physical component of the etch relative to the chemical component, a given etch can be made less selective i.e. it etches both the resist material and the film of interest (in this case $Si_xO_yN_z$) at roughly the same rate. Typically this is achieved by increasing the bombarding gas (Argon in most cases) ratio in the reactive gas mixture. This etch transfers the shape of the reflowed photoresist 440 to the new shape of the lens-formation dielectric layer 110a under the patterned photoresist. 440 and forms the microlens 640 out of the lens-formation dielectric layer 110a over the field oxide 410 as shown in FIG. 6. Block 760 then transfers control to block 770.

In block 770, the remaining photoresist on the wafer is removed. Block 770 then transfers control to block 780.

In block 780, the first dielectric layer 110 is removed from those areas of the wafer over which it is not wanted. Such removal may include the steps of applying photoresist to the wafer, exposing the photoresist per the pattern desired, and developing the exposed photoresist which results in removing the unexposed photoresist (or conversely removing the exposed photoresist), etching the first dielectric layer 110 in the photoresist exposed areas, and finally removing the remaining photoresist Block 780 then transfers control to block 790.

In block 790, the second dielectric layer 115 is created on top of the first dielectric layer 110. The second dielectric layer 115 could be, for example, an oxide layer or the like. The second dielectric layer 115 could be fabricated by chemical vapor deposition or by one of several other techniques well known to those of ordinary skill in the art. Block 790 then terminates the process.

FIG. 8 is a flow chart of sub-steps 800 of the flow chart of FIG. 7. In particular, FIG. 8 shows sub-process steps of block 740 of FIG. 7. Effectively block 730 of FIG. 7 transfers control to block 810 of FIG. 8. In block 810, photoresist 440 is applied to the wafer following creation (disposition) of the cover dielectric layer 410. Block 810 then transfers control to block 820.

In block 820, the photoresist 440 is exposed to a preselected pattern which matches that of the desired microlens 640. Block 820 then transfers control to block 830.

In block 830, the photoresist 440 is developed which removes the photoresist 440 in conformance with the preselected pattern. Block 830 then transfers control to block 750 of FIG. 7.

Depending upon the intended final configuration of the resultant integrated circuit structure, various steps in the above processes of FIGS. 7 and 8 may or may not be included.

In one representative embodiment, a semiconductor integrated circuit structure 100 is disclosed. The semiconductor integrated circuit structure 100 comprises a light sensitive device 108 integral with a semiconductor substrate 320, a first dielectric layer 110 disposed over the light sensitive device 108, and a second dielectric layer 115 disposed over the first dielectric layer 110. The semiconductor substrate 320 is silicon. Light is transmittable though the first dielectric layer 110 and through the second dielectric layer 115. The first dielectric layer 110 is fabricated from a silicide blocking material. The index of refraction of the first dielectric layer 110 at a preselected light frequency is within twenty-five percent of the square root of the product of index of refraction of the semiconductor substrate 320 and index of refraction of the second dielectric layer 115, and the thickness 165 of the first dielectric layer 110 is within twenty-five percent of length of a quarter wavelength of light at the preselected frequency in the first dielectric layer 110.

In another representative embodiment, a method for fabricating the semiconductor integrated circuit structure 100 is disclosed. The method comprises creating a light sensitive device 108, disposing a first dielectric layer 110 over the light sensitive device 108, and disposing a second dielectric layer 115 over the first dielectric layer 110. The semiconductor substrate 320 is silicon. Light is transmittable though the first dielectric layer 110 and through the second dielectric layer 115. The first dielectric layer is fabricated from a silicide blocking material. The index of refraction of the first dielectric layer 110 at a preselected light frequency is within twenty-five percent of the square root of the product of index of refraction of the semiconductor substrate 320 multiplied by index of refraction of the second dielectric layer 115, and the thickness 165 of the first dielectric layer 110 is within twenty-five percent of length of a quarter wavelength of light at the preselected frequency in the first dielectric layer 110.

In still another representative embodiment, a semiconductor integrated circuit structure 100 is disclosed. The semiconductor integrated circuit structure 100 comprises a light sensitive device 108 integral with a semiconductor substrate 320, a cover dielectric layer 410 disposed over the light sensitive device 108, and a lens-formation dielectric layer disposed 11a over the cover dielectric layer 410. Light is transmittable though the cover dielectric layer 410; and through the lens-formation dielectric layer 110a. The lens-formation dielectric layer 110a forms an embedded convex microlens 640. The microlens 640 directs light onto the light sensitive device 108.

And, in yet another representative embodiment, a method for fabricating a semiconductor integrated circuit structure 100 is disclosed. The method comprises creating a light sensitive device 108 integral with a semiconductor substrate 320, disposing a cover dielectric layer 410 over the light sensitive device 108, and disposing a lens-formation dielectric layer 110a over the cover dielectric layer 410. Light is transmittable though the cover dielectric layer 410 and through the lens-formation dielectric layer 110a. The lens-formation dielectric layer 110a forms an embedded convex microlens 640. The microlens 640 directs light onto the light sensitive device 108.

In representative embodiments, techniques for improving the sensitivity of photosensitive devices 108 have been disclosed. In particular, such techniques can be used with CMOS image sensors wherein the first dielectric layer 110 can be used to, not only block the formation of silicides on silicon and polysilicon, but by appropriate adjustment of the index of refraction and thickness of the first dielectric layer 110 to also serve as an antireflection layer. Blocking the formation of silicides results in areas that are of relatively low stress which results in a smaller number of defects in the silicon. The smaller number of defects results in lower leakage currents in the photosensitive devices 108. As previously stated, the leakage current and any other unintended sources of current are often referred to as the dark current due to the fact that when the image sensor receives no illumination, it is this leakage current and the other intended currents that are measured. The dark current determines the lowest light level detection limit. Thus, in CMOS and other image sensors, it is important to reduce the leakage current to the lowest possible level.

The reflective properties of the structure can be adjusted so as to provide enhancement for light frequencies for which the light sensitive device is normally less sensitive, as for example the blue band for silicon.

The first dielectric layer 110 can be shaped such that it behaves like an optical microlens. It provides some focusing of the light on a photosensitive device which is created underneath the microlens. This structure has other benefits such as lower cross talk Optical cross-talk is caused by light which should be directed toward one pixel, but which instead impinges on an adjacent pixel. As applications for image sensors and other photosensitive devices require smaller and smaller pixel sizes, cross-talk becomes more and more of a problem. Cross-talk is reduced due to the focusing of the light onto a given pixel.

The above described techniques of forming a microlens out of the first dielectric layer 110 over given photosensitive devices and of forming an antireflective/silicide-block coating in other areas of the structure can be combined for given circuits.

The representative embodiments, which have been described in detail herein, have been presented by way of example and not by way of limitation. It will be understood by those skilled in the art that various changes may be made in the form and details of the described embodiments resulting in equivalent embodiments that remain within the scope of the appended claims.

What is claimed:

1. A method of fabricating a semiconductor integrated circuit structure, the method comprising the steps of:
    disposing a cover dielectric over a light sensitive device integral with a semiconductor substrate; and
    disposing a lens-formation dielectric over the cover dielectric, the lens-formation dielectric formed from a silicon-rich oxynitride having an index of refraction adjustable by changing relative atomic percentages of silicon, oxygen and nitrogen,
    wherein the step of disposing the cover dielectric over the light sensitive device comprises the steps of:
    applying a photoresist over the light sensitive device;
    exposing the photoresist in a preselected pattern;
    developing the photoresist in a preselected pattern, to remove the photoresist in conformance with the preselected pattern;
    etching the light sensitive device in the area where the photoresist has been exposed; and
    removing the photoresist remaining after etching to form the cover dielectric in the etched areas.

2. The method of claim 1,
    wherein the index of refraction of the silicon-rich oxynitride is adjustable in the range of 1.70 to 1.85.

3. The method of claim 1, further comprising the step of creating the light sensitive device.

4. The method of claim 1, wherein the step of disposing the lens-formation dielectric over the cover dielectric comprises the following steps:
    applying a photoresist over the cover dielectric;
    exposing the photoresist in a preselected pattern;
    developing the photoresist to remove the photoresist in conformance with the preselected pattern;
    reflowing the remaining photoresist; and
    etching the lens-formation dielectric and remaining photoresist with an etch having a low selectivity between the lens-formation dielectric and the photoresist.

5. A method of fabricating a semiconductor integrated circuit structure, the method comprising the steps of:
    forming an n-type well in a p-type silicon substrate;
    etching at least a portion of the silicon substrate to form a recessed portion in the silicon substrate;
    growing a cover dielectric in the recessed portion;
    disposing a lens-formation dielectric on top of the cover dielectric, the lens-formation dielectric layer formed from a silicon-rich oxynitride having an index of refraction adjustable by changing relative atomic percentages of silicon, oxygen and nitrogen.

6. The method of claim 5,
    wherein the index of refraction of the silicon-rich oxynitride is adjustable in the range of 1.70 to 1.85.

7. The method of claim 5, wherein the step of disposing a lens-formation dielectric over the cover dielectric comprises the following steps:
    applying a photoresist over the cover dielectric;
    exposing the photoresist in a preselected pattern;
    developing the photoresist to remove the photoresist in conformance with the preselected pattern;
    reflowing the remaining photoresist; and
    etching the lens-formation dielectric and remaining photoresist with an etch having a low selectivity between the lens-formation dielectric and the photoresist.

8. A method of fabricating a semiconductor integrated circuit structure, the method comprising the steps of:
    disposing a cover dielectric over a light sensitive device integral with a semiconductor substrate; and
    disposing a lens-formation dielectric over the cover dielectric, the lens-formation dielectric formed from a silicon-rich oxynitride having an index of refraction adjustable by changing relative atomic percentages of silicon, oxygen and nitrogen;
    wherein the step of disposing the lens-formation dielectric over the cover dielectric comprises the following steps:
    applying a photoresist over the cover dielectric;
    exposing the photoresist in a preselected pattern;
    developing the photoresist to remove the photoresist in conformance with the preselected pattern;
    reflowing the remaining photoresist; and
    etching the lens-formation dielectric and remaining photoresist with an etch having a low selectivity between the lens-formation dielectric and the photoresist.

9. The method of claim 8,
    wherein the index of refraction of the silicon-rich oxynitride is adjustable in the range of 1.70 to 1.85.

10. The method of claim 8, further comprising the step of creating the light sensitive device.

11. The method of claim 8, wherein the step of disposing the cover dielectric over the light sensitive device comprises the steps of:
    applying a photoresist over the light sensitive device;
    exposing the photoresist in a preselected pattern;
    developing the photoresist in a preselected pattern, to remove the photoresist in conformance with the preselected pattern;
    etching the light sensitive device in the area where the photoresist has been exposed; and
    removing the photoresist remaining after etching to form the cover dielectric in the etched areas.

* * * * *